(12) United States Patent
Matsuda et al.

(10) Patent No.: US 11,963,448 B2
(45) Date of Patent: Apr. 16, 2024

(54) METHOD FOR PRODUCING THERMOELECTRIC CONVERSION ELEMENT

(71) Applicant: Proterial, Ltd., Tokyo (JP)

(72) Inventors: Michiko Matsuda, Tokyo (JP); Takeshi Shimada, Tokyo (JP)

(73) Assignee: Proterial, Ltd., Tokyo (JP)

( * ) Notice: Subject to any disclaimer, the term of this patent is extended or adjusted under 35 U.S.C. 154(b) by 0 days.

(21) Appl. No.: 17/911,924

(22) PCT Filed: Mar. 22, 2021

(86) PCT No.: PCT/JP2021/011561
§ 371 (c)(1),
(2) Date: Sep. 15, 2022

(87) PCT Pub. No.: WO2021/193481
PCT Pub. Date: Sep. 3, 2021

(65) Prior Publication Data
US 2023/0180608 A1 Jun. 8, 2023

(30) Foreign Application Priority Data
Mar. 23, 2020 (JP) ................. 2020-050787

(51) Int. Cl.
*H10N 10/01* (2023.01)
*H10N 10/854* (2023.01)
(52) U.S. Cl.
CPC .......... *H10N 10/01* (2023.02); *H10N 10/854* (2023.02)

(58) Field of Classification Search
CPC ................. H10N 10/01; H10N 10/854
See application file for complete search history.

(56) References Cited

U.S. PATENT DOCUMENTS

| 6,207,886 B1 | 3/2001 | Kusakabe et al. |
| 2006/0053969 A1 | 3/2006 | Harada et al. |
| 2014/0311186 A1 | 10/2014 | Ogawa et al. |

FOREIGN PATENT DOCUMENTS

| CN | 109192851 A | 1/2019 |
| EP | 3859798 A1 | 8/2021 |

(Continued)

OTHER PUBLICATIONS

Jian Yang, "Thermoelectric Properties of CoSb3-Based Skutterudites", Thesis, Boston College University, Aug. 2010, http://hdl.handle.net/2345/1418. (Year: 2010).*

(Continued)

*Primary Examiner* — Tae-Sik Kang
(74) *Attorney, Agent, or Firm* — Nakanishi IP Associates, LLC

(57) ABSTRACT

When a size is increased for mass production, an area of a pressurized surface is increased. This raised a problem in that insufficient load or the like causes a pressure during pressure sintering and a relative density of a thermoelectric conversion element to be likely to become insufficient. As a solution, there is provided a method for producing a thermoelectric conversion element, including: a step of mixing a skutterudite-type thermoelectric conversion material powder containing Sb and a sintering agent containing a compound including Mn and Sb, to obtain a mixture; and a step of sintering the mixture.

12 Claims, 8 Drawing Sheets

```
S1  THERMOELECTRIC CONVERSION MATERIAL
    POWDER PREPARING STEP
```

```
S2  SINTERING ASSISTANT MIXING STEP
```

```
S3  SINTERING STEP
```

(56) References Cited

FOREIGN PATENT DOCUMENTS

| | | |
|---|---|---|
| JP | H3-068743 A | 3/1991 |
| JP | 2005-200249 A | 7/2005 |
| WO | 2004/049464 A1 | 6/2004 |
| WO | 2013/009430 A1 | 1/2013 |
| WO | 2013-100074 A1 | 7/2013 |
| WO | 2017/038988 A1 | 3/2017 |

OTHER PUBLICATIONS

International Search Report issued in PCT/JP2021/011561 dated Jun. 1, 2021 with English Translation (5 pages).
Written Opinion of International Searching Authority issued in PCT/JP2021/011561 dated Jun. 1, 2021 with English Translation (5 pages).
Extended European Search Report issued in European Patent Application No. 21775669.1, mailed on Feb. 13, 2024 (6 pages).

* cited by examiner (a)

↔ 10μm (b)

← → 10μm (a)

↔ 10μm (b)

←→ 10μm

←→ 10μm

←→ 10μm

METHOD FOR PRODUCING THERMOELECTRIC CONVERSION ELEMENT

TECHNICAL FIELD

The present invention relates to a thermoelectric conversion element which directly converts heat energy into electric energy.

BACKGROUND ART

In recent years, a study has been conducted to recover, as electricity, heat exhausted from, for example, a boiler, an incinerator, and a heat source of an automobile, for reducing energy consumption. Particular attention is paid on a thermoelectric conversion module which can efficiently recover electric energy using a thermoelectric conversion element capable of directly converting heat energy into electric energy by the Seebeck effect. A most practically realized material is a $Bi_2Te_3$-based compound which is mainly used in a temperature range from normal temperature to about 200° C. Another widespread material is being sought which exerts high thermoelectric performance in various temperature ranges. Particularly, inorganic materials based on silicide, Pb—Te, skutterudite, Si—Ge, and Heusler are shown to exhibit high thermoelectric characteristics in a high temperature range of 300° C. or higher and intensively studied.

A well-known inorganic material thermoelectric conversion module is one having a π-type shape in which an N-type element having electrons as a carrier and a P-type element having holes as a carrier are aligned and connected at one end through an electrode. An element used in a pi-type module is a rectangular parallelepiped or a cube of several millimeters to 1 cm. This also requires a technology for highly efficiently preparing an element bulk material of several millimeters. A common method therefor is a method of melting a raw material to obtain a material having a desired composition, shaping the material into powder by pulverization or the like, and thereafter pressure-sintering the powder. Pressure-sintering is a method of simultaneously performing sintering and forming by compression during heating. Examples of used pressure-sintering include hot pressing, hot isostatic pressing (HIP), and spark plasma sintering (SPS) in which mechanical pressurization and pulse electric current heating are simultaneously performed.

For example, Patent Literature 1 discloses a thermoelectric conversion element including a skutterudite-based compound $Ce_{0.2}Co_{3.95}Mn_{0.05}Sb_{12}$ and a method for producing the thermoelectric conversion element. In this production method, a metal material containing Ce, Co, Mn, and Sb is poured in a quartz tube, sealed in vacuum, melted at 1100° C. for 12 hours, and thereafter quenched in water. The obtained ingot is heat-treated at 800° C. for 120 hours to obtain a powder. The powder is sintered by SPS technique at 600° C. for 5 minutes under a pressure of 50 MPa.

Also, Patent Literature 2 discloses a thermoelectric conversion material having a crystal average particle size of 50 nm or less in which the relative density of the thermoelectric conversion material is 85% or more, and a method for producing the thermoelectric conversion material. In this production method, a pulverized powder is prepared and then sintered or solidified under a pressure of 0.5 GPa or more and 10 GPa or less.

CITATION LIST

Patent Literature

PATENT LITERATURE 1: WO 2013/009430 A
PATENT LITERATURE 2: WO 2004/049464 A

SUMMARY OF INVENTION

Problems to be Solved by Invention

The method of Patent Literature 1 has a problem in that when the thermoelectric conversion element is increased in size for mass production, insufficient pressure or the like is likely to cause the thermoelectric conversion element to have an insufficient relative density. On the other hand, when a pulverized powder is obtained as in Patent Literature 2, a specific surface area increases, which likely causes oxidation to proceed in a pre-sintering stage. Therefore, when this is used to obtain a thermoelectric conversion element, a problem is raised in that thermoelectric performance of the thermoelectric conversion element is likely to decrease.

An object of the present invention is to provide a method for producing a thermoelectric conversion element which is suitable for increasing in density and excellent in mass productivity while retaining thermoelectric characteristics.

Solution to Problems

According to the present invention, there is provided a method for producing a thermoelectric conversion element, including: a step of mixing a skutterudite-type thermoelectric conversion material powder containing Sb and a sintering agent containing a compound including Mn and Sb, to obtain a mixture; and a step of sintering the mixture.

Moreover, preferably, the compound including Mn and Sb has a peak of a crystal structure of at least one of Mn1.1Sb and Mn2Sb observed by XRD.

Moreover, preferably, in the mixture, the sintering agent is 10 mass % or less relative to a total amount of the thermoelectric conversion material and the sintering agent.

Moreover, preferably, the thermoelectric conversion material powder contains Yb and Co.

Moreover, preferably, the thermoelectric conversion material powder contains Ce and Fe.

Effects of Invention

According to the present invention, there can be provided a method for producing a thermoelectric conversion element which is suitable for increasing in density and excellent in mass productivity while retaining thermoelectric characteristics.

DESCRIPTION OF EMBODIMENTS

Figure 1:
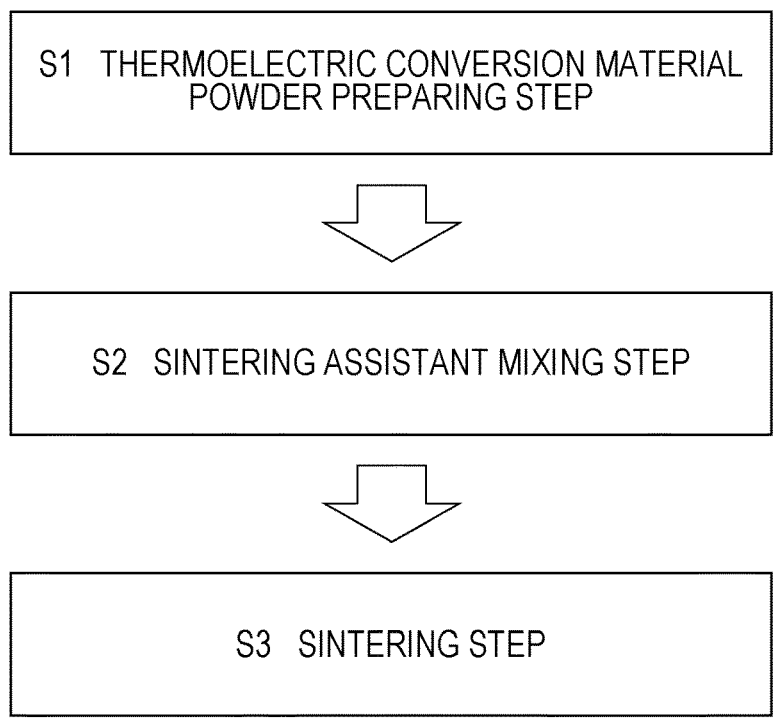
FIG. 1 is a flowchart illustrating a method for producing a thermoelectric conversion element.

An embodiment of the method for producing a thermoelectric conversion element according to the present invention will be described below. The method for producing a thermoelectric conversion element according to the present embodiment includes, as illustrated in FIG. 1, a step of preparing a skutterudite-type thermoelectric conversion material powder containing Sb (S1: thermoelectric conversion material powder preparing step), a step of mixing the thermoelectric conversion material powder and a sintering agent containing a compound including Mn and Sb, to obtain a mixture (S2: sintering agent mixing step), and a step of sintering the mixture (S3: sintering step). It is noted that the step of preparing a skutterudite-type thermoelectric conversion material powder containing Sb (S1: thermoelectric conversion material powder preparing step) may be omitted by, for example, purchasing a skutterudite-type thermoelectric conversion material powder containing Sb.

Figure 2:
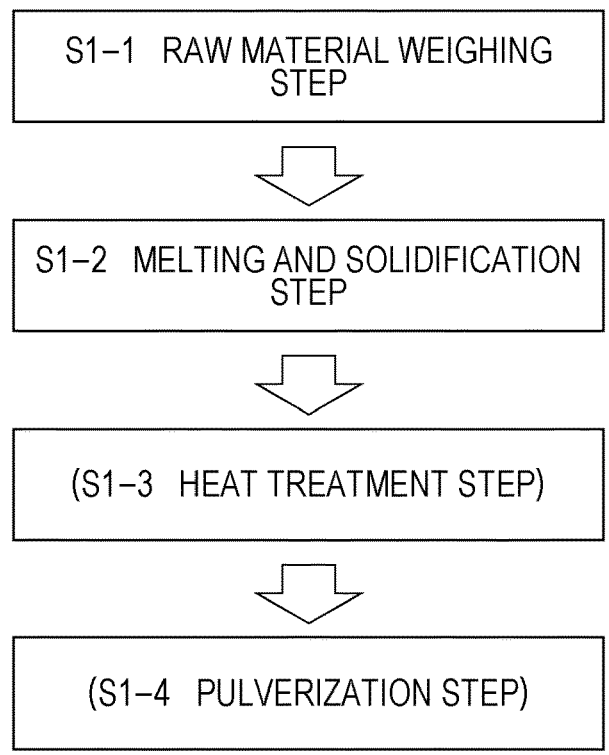
FIG. 2 is a flowchart illustrating steps for preparing a thermoelectric conversion material powder.

First, the step of preparing a thermoelectric conversion material powder, illustrated in FIG. 2, will be described below. The thermoelectric conversion material according to the present invention contains Sb and has a skutterudite-type crystal structure. Examples thereof include a material based on $CoSb_3$ containing Yb, $CoSb_3$, $CoSb_3$ containing Ce, or $FeSb_3$ containing Ce. For example, a metal raw material is weighed according to a composition formula of a desired thermoelectric conversion material such as $Yb_{0.3}Co_4Sb_{12}$ (S1-1: raw material weighing step). In the weighing, antimony (Sb), which has a high vapor pressure, may be increased in amount to some degree, e.g., by 1 to 3 mass %, in consideration of slight evaporation during heating. Also, an easily-oxidizable raw material such as cerium (Ce) is preferably weighed in an inert atmosphere.

The weighed metal raw material is melted and solidified in an electric furnace or a high-frequency furnace in a non-oxidizing atmosphere (S1-2: melting and solidification step). As a non-oxidizing atmosphere, inert gas (such as argon and nitrogen $N_2$) may be used, and a quartz tube or the like may be filled with vacuum. In the melting and solidification, liquid quenching solidification may be used. The melting and the liquid quenching solidification may be successively performed in the same furnace. Alternatively, a raw material mixture ingot may be temporarily prepared by melting, and the ingot may be heated and melted again and subjected to liquid quenching solidification. For example, in the case of high-frequency melting, an ingot is obtained by observing that the phase is entirely liquid with molten metal being stirred by high frequency, maintaining the molten metal for about tens of seconds to several minutes, and thereafter pouring the molten metal into a mold. Examples of a method for liquid quenching solidification include a method of revolving a roll at about 100° C. or lower (alternatively, room temperature, water cooling, or the like) and allowing melted molten metal to flow on the roll and a method of spraying molten metal melted in a crucible equipped with a nozzle, from the nozzle by gas pressure. A sample obtained by liquid quenching solidification preferably has a ribbon-like shape and a thickness ranging from 1 µm or more to 1 mm or less. The ribbon-like sample solidified by quenching is in a state in which skutterudite crystals, an amorphous mixture, an intermetallic compound other than skutterudite, and others are mixed. For increasing skutterudite crystals, a heat treatment (S1-3: heat treatment step) may be performed in a non-oxidizing atmosphere at a prescribed temperature. Whether or not the main phase of the thermoelectric conversion material is of skutterudite type can be checked by X-ray diffraction (XRD).

The skutterudite material obtained by heat-treating the ribbon-like sample may be pulverized in an inert atmosphere (S1-4: pulverization step). Examples of the pulverization method to be used include a hammer mill, a jet mill, a ball mill, and a kneader equipped with a mortar. For average particle diameter, wet laser diffraction or the like may be used. For example, D50 is desirably 0.5 µm or more and 100 µm or less, preferably 1 µm or more and 80 µm or less, and further preferably 2 µm or more and 50 µm or less. After pulverization, a method of sieving into fine and coarse powders, for example, may be appropriately used.

Figure 3:
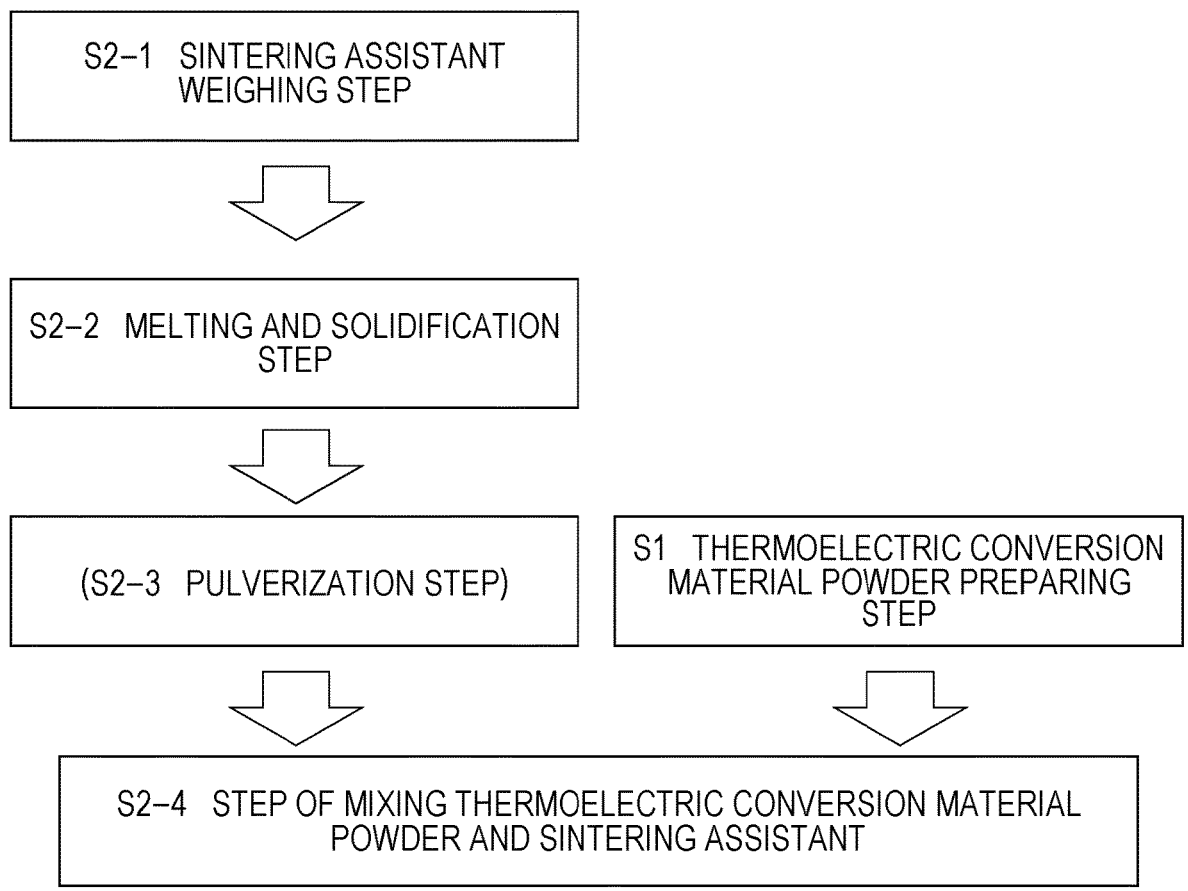
FIG. 3 is a flowchart illustrating a step of mixing a thermoelectric conversion material powder and a sintering agent and steps associated with the mixing step.

Next, the step of mixing the thermoelectric conversion material powder and a sintering agent containing a compound including Mn and Sb, to obtain a mixture (S2-4: step of mixing thermoelectric conversion material powder and sintering agent), illustrated in FIG. 3, will be described. The powder of the thermoelectric conversion material and a sintering agent are sufficiently mixed and dispersed such that densification proceeds in the sintering step. For example, rotating mixing or the like may be performed using a mill with a medium, mortar mixing, a V-type mixer, and others. Hereinafter, a sintering agent to be used will be described. The sintering agent in the present embodiment contains a compound including Mn and Sb. When such a sintering agent and the thermoelectric conversion material powder are mixed and sintered, the effect of facilitating sintering is obtained. Here, for the compound including Mn and Sb, an intended compound can be obtained by, for example, weighing pure manganese and pure antimony at an atomic ratio of Mn/Sb=0.2 to 3 (S2-1: sintering agent weighing step) and melting the weighed product (S2-2: melting and solidification step). The agent component obtained in this manner comes to be, for example, a mixed body of MnSb and Sb when atomic ratio Mn/Sb is 1 or less, MnSb when atomic ratio Mn/Sb=around 1, and a mixture of MnSb and $Mn_2Sb$ when atomic ratio Mn/Sb>1.2. When Mn/Sb>2, the component is in a state in which excessive Mn is mixed to $Mn_2Sb$. That is, it can be said that the compound including Mn and Sb contains a compound (hereafter, sometimes denoted as $Mn_{1.1}Sb$) in which Mn is about 1 relative to Sb or a compound (hereafter, sometimes denoted as $Mn_2Sb$) in which Mn is about 2 relative to Sb. Whether or not the compound including Mn and Sb is contained can be checked by XRD. According to the alloy phase diagram of Mn and Sb, either $Mn_{1.1}Sb$ or $Mn_2Sb$ is a stable alloy. Therefore, a compound containing these is used. That is, a peak of a crystal structure of at least one of $Mn_{1.1}Sb$ and $Mn_2Sb$ may be observed by XRD of the compound including Mn and Sb as a sintering agent.

It is noted that in the melting process (S2-2: melting and solidification step) as the previous step to the mixing step, either an electric furnace or a high-frequency furnace may be used. Also, a liquid quenching solidification method may be used. The following pulverization step is facilitated by performing melting using a liquid quenching solidification apparatus equipped with a metal roll and allowing molten metal to flow on the revolving roll for quenching solidification to obtain a ribbon-like sample. Subsequently, the ingot-shaped material obtained by melting and solidification may be pulverized into powder (S2-3: pulverization step). When the powder is sufficiently dispersed and coordinated on the surface of the thermoelectric conversion material powder, it effectively serves as a sintering agent. Whether or not the thermoelectric conversion material and the sintering agent are uniformly dispersed may be checked by, for example, observing the distribution of elements such as Mn in the agent and Co or Fe in the thermoelectric conversion material by scanning electron microscope energy dispersive X-ray spectroscopy (SEM-EDX). Since the amount of the thermoelectric conversion material is desirably not significantly reduced relative to the amount of the entirety, the added amount of the sintering agent relative to the total amount of the thermoelectric conversion material and the sintering agent is, for example, preferably 10 mass % or less and further preferably 0.01 mass % or more and 2 mass % or less.

Figure 4:
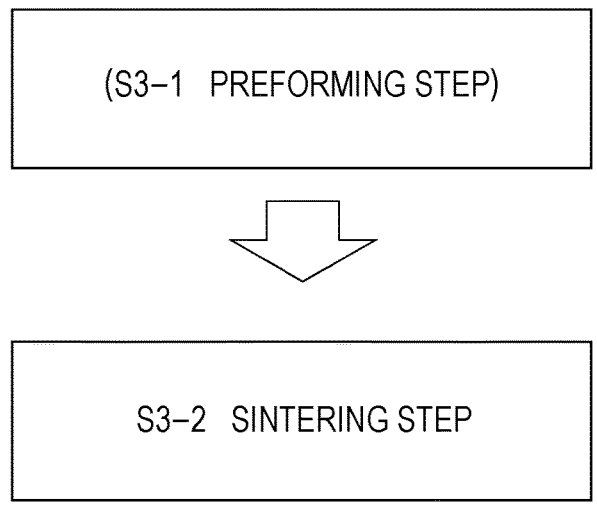
FIG. 4 is a flowchart illustrating a sintering step.

Next, the sintering step illustrated in FIG. 4 will be described.

For obtaining a dense bulk by a solid phase reaction, a skutterudite thermoelectric conversion element is obtained by placing the mixture in a mold for pressure sintering and performing a pressure heat treatment (S3-2: sintering step) or by forming a green compact by uniaxial pressing, cold isostatic pressing (CIP), or the like (S3-1: preforming) and performing a heat treatment (S3-2: sintering step) to sinter the green compact. When a mold is increased in size while an apparatus having the same press ability is used, i.e., when a surface area increases while a force applied on the surface is constant so that a force per unit area decreases, use of the sintering agent allows density to increase by pressure sintering at 45 MPa or less and even by sintering without pressure. As a result, with reference to a density of a sintered body, as a thermoelectric conversion element, obtained by a pressure heat treatment at 50 MPa or more, a relative density of 90% or more is obtained even by sintering without pressure, and a relative density of 97% or more is obtained by a pressure heat treatment at about 10 MPa. For example, the density can be increased even at a pressure of 35 MPa or less, 15 MPa or less, and furthermore, 10 MPa or less. When the sintering agent is added in an amount of 0.05 to 2 mass %, and a pressure heat treatment at about 10 MPa is performed, $Yb_{0.3}Co_4Sb_{12}$, for example, can have a favorable value as a power factor with 5 $mW \cdot m^{-1} \cdot K^{-2}$ or more at 500° C. The temperature in sintering is preferably 550° C. or higher and 860° C. or lower. At 550° C. or higher, sintering is likely to proceed. At 860° C. or lower, decomposition of skutterudite is likely to be suppressed. The atmosphere is preferably non-oxidizing, and inert gas (such as argon Ar and nitrogen $N_2$) or vacuum may be used. Alternatively, reducing hydrogen can also be used. It is noted that in the following Examples, the obtained sintered bodies were processed into a size for evaluation using a slicer or the like and used for evaluation.

EXAMPLES

Example 1

As a sintering agent, MnSb was assumed. Manganese (manufactured by Kojundo Kagaku, 3 N, particle diameter: 300 μm or less) and antimony (manufactured by Nihon Seiko, 4 N, granular) were weighed such that atomic ratio (Mn/Sb)=1 was achieved. The weighed raw material was put in a carbon crucible and heated and melted in an argon atmosphere in a high-frequency melting furnace. After it was observed that molten metal was stirred by high frequency, the molten metal was poured into a mold. The ingot solidified in the mold was set in a liquid quenching solidification apparatus and melted in an argon atmosphere again. The temperature of the molten metal was measured by a radiation thermometer until 1100° C. was reached. Thereafter, the molten metal was sprayed on a revolving copper roll for quenching solidification to obtain a ribbon-like material. The ribbon-like material was pulverized by a shredder (blade mill) to obtain a sintering agent (MnSb fine powder). This sintering agent powder was measured by XRD. As a result, a peak of an $Mn_{1.1}Sb$ single phase was obtained as a compound including Mn and Sb.

Figure 6:
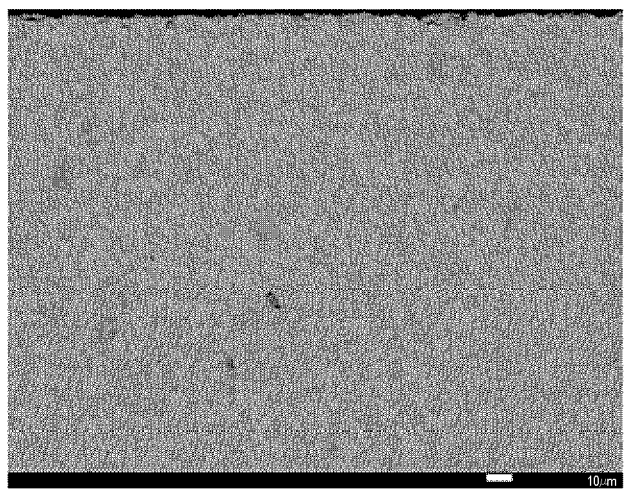
FIG. 6 is SEM photographs of a cross section of Example 1 observed at magnifications of (a) 500× and (b) 2000×.
Figure 6:
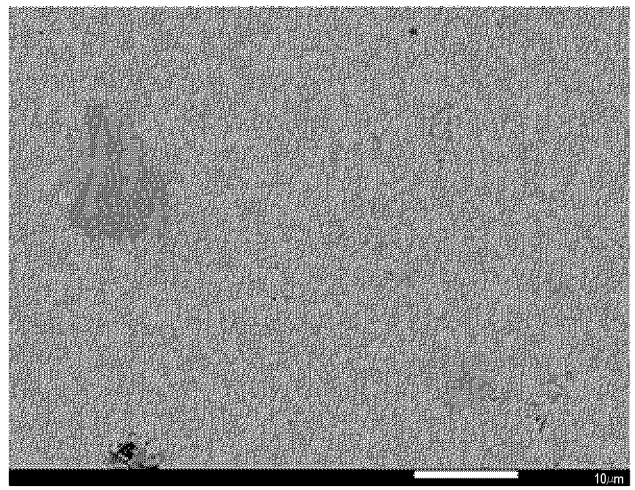

According to the composition formula of a thermoelectric conversion material $Yb_{0.3}Co_4Sb_{12}$, pure metals Yb, Co, and Sb were weighed. The weighed pure metal raw material was put in a carbon crucible and heated and melted in an inert gas atmosphere in a high-frequency melting furnace. After it was observed that molten metal was stirred by high frequency, the molten metal was poured into a mold. The ingot solidified in the mold was set in a liquid quenching solidification apparatus and melted again in an inert atmosphere. The temperature of the molten metal was measured by a radiation thermometer until 1150° C. was reached. Thereafter, the molten metal was sprayed on a revolving copper roll for quenching solidification. The quenching-solidified material was heat treated at 700° C. for 24 hours in an inert atmosphere and thereafter pulverized using a hammer mill. Accordingly, a powder (skutterudite powder) of a thermoelectric conversion material was obtained. To the skutterudite powder, the above-described MnSb fine powder was added in an amount of 1 mass % relative to the total amount. The mixture was mixed using a mix rotor at 1500 revolutions. Twenty grams of the mixed powder was set in a carbon mold having an inner diameter of ϕ30 mm and maintained at 700° C. under a press pressure of 15 MPa for 1 hour in an argon atmosphere. That is, the mixture was put in a mold for pressure sintering and sintered under pressure. A dense sintered body having an apparent density of 7.74 $Mg/m^3$ was obtained. It is noted that the apparent density was calculated by the Archimedes method. The inside of the sintered body was observed by SEM to find that a dense bulk body was obtained as illustrated in FIG. 6.

Figure 5:
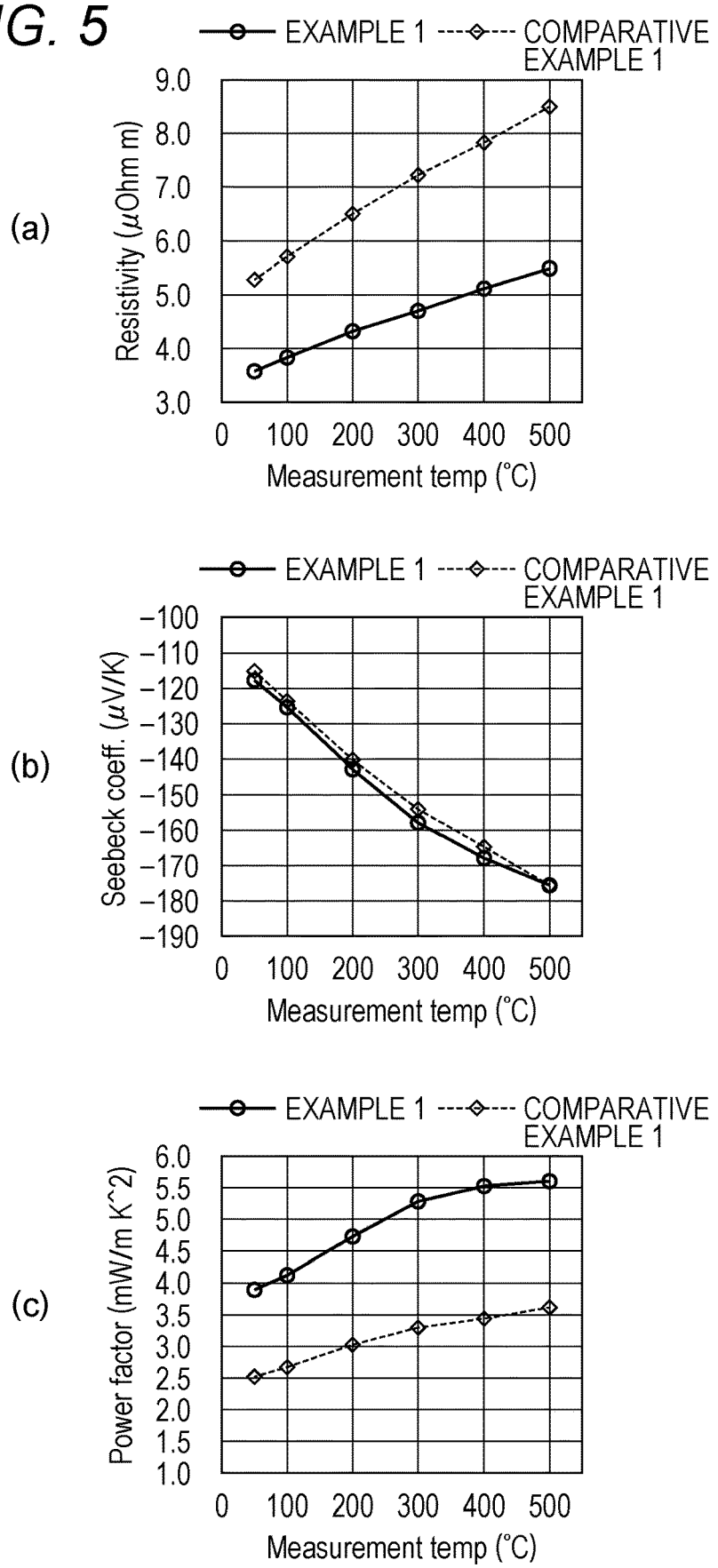
FIG. 5 is a comparison between Example 1 and Comparative Example 1 in (a) electric resistance, (b) Seebeck coefficient, and (c) power factor.

The obtained sintered body was cut for measurement, and the thermoelectric characteristics were measured by a ZEM-3 of Advance Riko. The result is indicated in FIG. 5. As understood from FIG. 5, at 300° C., a Seebeck coefficient is −158 μV/K, an electric resistance rate is 4.69 μΩm, and a power factor is 5.29 $mW \cdot m^{-1} \cdot K^{-2}$. At 400° C., a Seebeck coefficient is −168 μV/K, an electric resistance rate is 5.09 μΩm, and a power factor is 5.55 $mW \cdot m^{-1} \cdot K^{-2}$. At 500° C., a Seebeck coefficient is −175 μV/K, an electric resistance rate is 5.48 μΩm, and a power factor is 5.60 mW·m$^{-1}$·K$^{-2}$. The resistance was lower, and the power factor was higher, compared to Comparative Example 1 described later.

Comparative Example 1

Figure 7:
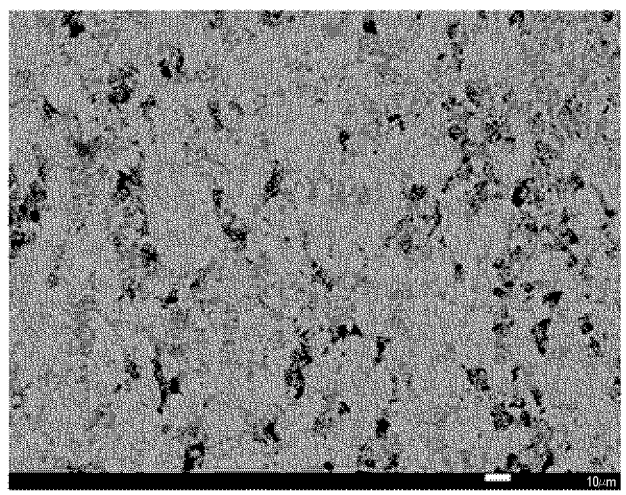
FIG. 7 is SEM photographs of a cross section of Comparative Example 1 observed at magnifications of (a) 500× and (b) 2000×.
Figure 7:
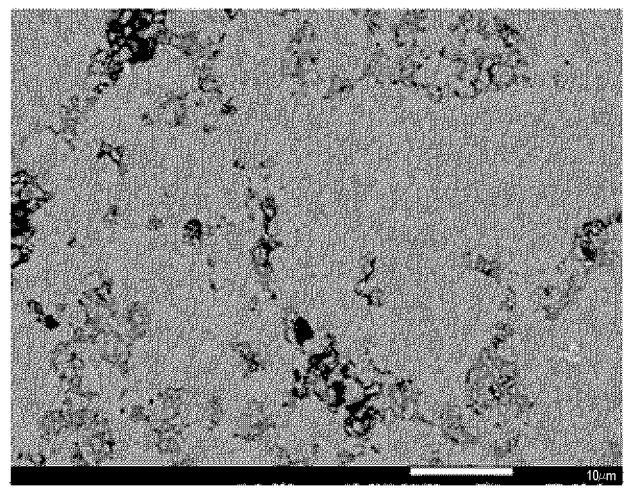

A sintered body was prepared and evaluated in a similar manner to that of Example 1, except that a sintering agent was not added. The apparent density by the Archimedes method of this sintered body was 7.45 Mg/m$^3$. The cross section of the sintered body was observed by SEM to find that voids exist in the entire material as illustrated in FIG. 7.

The obtained sintered body was cut for measurement, and the thermoelectric characteristics were measured by a ZEM-3 of Advance Riko. The result is indicated in FIG. 5. As understood from FIG. 5, at 300° C., a Seebeck coefficient is −154 μV/K, an electric resistance rate is 7.19 μΩm, and a power factor is 3.29 mW·m$^{-1}$·K$^{-2}$. At 400° C., a Seebeck coefficient is −165 μV/K, an electric resistance rate is 7.84 μΩm, and a power factor is 3.46 mW·m$^{-1}$·K$^{-2}$. At 500° C., a Seebeck coefficient was −176 μV/K, an electric resistance rate was 8.49 μΩm, and a power factor was 3.63 mW·m$^{-1}$·K$^{-2}$.

Example 2

In a similar manner to Example 1, an MnSb fine powder as a sintering agent and a Yb$_{0.3}$Co$_4$Sb$_{12}$ skutterudite powder as a thermoelectric conversion material were prepared and mixed. Sintering was performed in a similar manner to that in Example 1, except that the press pressure was 10 MPa, and the maintained time was 1 hour. The apparent density by the Archimedes method of this sintered body was 7.70 Mg/m$^3$. The inside of the sintered body was observed by SEM to find that a dense bulk body was obtained.

The obtained sintered body was cut for measurement, and the thermoelectric characteristics were measured using a ZEM-3 of Advance Riko. As a result, at 300° C., a Seebeck coefficient is −158 μV/K, an electric resistance rate is 5.31 μΩm, and a power factor is 4.68 mW·m$^{-1}$·K$^{-2}$. At 400° C., a Seebeck coefficient is −168 μV/K, an electric resistance rate is 5.76 μΩm, and a power factor is 4.92 mW·m$^{-1}$·K$^{-2}$. At 500° C., a Seebeck coefficient is −176 μV/K, an electric resistance rate is 6.06 μΩm, and a power factor is 5.11 mW·m$^{-1}$·K$^{-2}$. It was demonstrated that the resistance was lower, and the power factor was higher, compared to Comparative Example 1.

Example 3

As a sintering agent, manganese and antimony were weighed such that Mn/Sb atomic ratio=1.8 was achieved. A powder of a sintering agent was prepared by a similar process to that of Example 1 thereafter. This sintering agent was measured by XRD to find that this sintering agent was a mixture of Mn$_{1.1}$Sb and Mn$_2$Sb. A Yb$_{0.3}$Co$_4$Sb$_{12}$ skutterudite powder was prepared by a similar process to that of Example.

Figure 8:
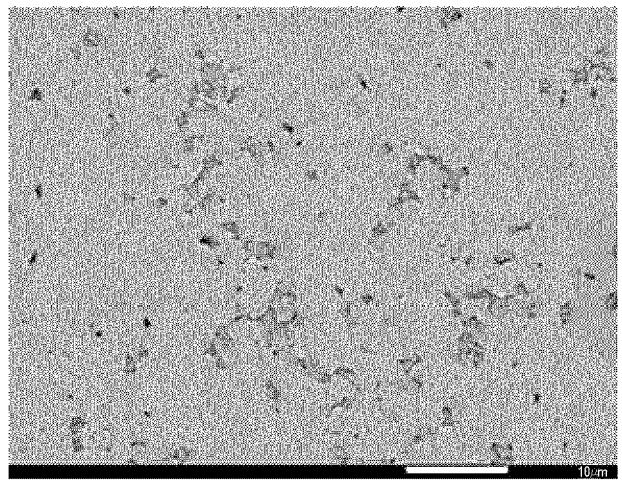
FIG. 8(*a*) is an SEM photograph of a cross section of Example 3 observed at a magnification of 2000×, and FIG. 8(*b*) is an SEM photograph of a cross section of Comparative Example 3 observed at a magnification of 2000×.
Figure 8:
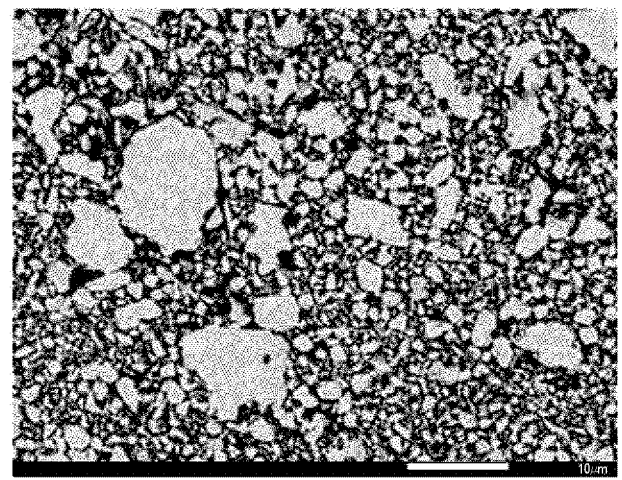

To the Yb$_{0.3}$Co$_4$Sb$_{12}$ skutterudite powder, 1 mass % of the MnSb fine powder was added. The mixture was mixed using a mortar. Two grams of the mixed powder was set in a mold having an inner diameter of φ10 mm and press-formed at 15 kN at room temperature by uniaxial pressing. The formed body was placed in a vacuum furnace, increased in temperature at 35° C./min with a vacuum degree of less than 10 Pa, and thereafter maintained at 730° C. for 1 hour. That is, the mixture was put in a mold for forming, press-formed, and thereafter sintered in vacuum without pressurization. While the formed body before sintering was φ10 mm, the formed body after a heat treatment, i.e., after sintering, was φ8.97 mm, which indicates 10% shrinkage. The apparent density by the Archimedes method was 7.52 Mg/m$^3$. An SEM observation was performed to find that sintering proceeded as illustrated in FIG. 8(a).

As seen from the above-described examples, a density of 7.50 Mg/m$^3$ or more can be obtained without pressurization, and a density of 7.70 Mg/m$^3$ or more can be obtained with a pressure of 15 MPa or less.

Comparative Example 2

Two grams of a skutterudite powder of the same batch as that used in Example 3 was set in a mold having an inner diameter of $10 mm and press-formed at 15 kN at room temperature by uniaxial pressing. The formed body was placed in a vacuum furnace, increased in temperature at 35° C./min with a vacuum degree of less than 10 Pa, and thereafter maintained at 730° C. for 1 hour. The diameter of the sample after the heat treatment was φ10 mm, which was similar to before the heat treatment. The structure was observed by SEM to find that the skutterudite powder was maintained as it was without being sintered as illustrated in FIG. 8(b).

Example 4

Figure 9:
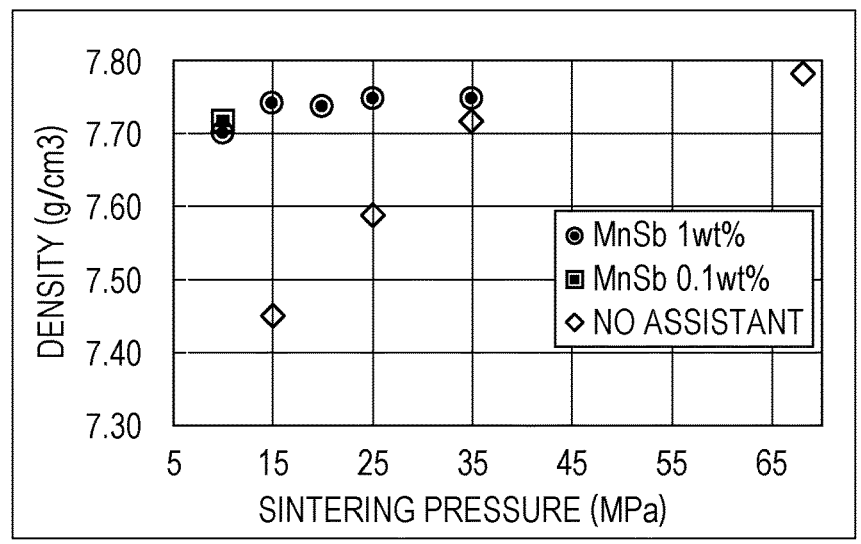
FIG. 9 is a diagram illustrating a relationship of density of a thermoelectric conversion element to sintering pressure.

A skutterudite powder and an MnSb fine powder were prepared by a similar process to that of Example 1 and Example 2. The density changes of the sintered body when the sintering pressure was varied in a range of 10 MPa or more and 68 MPa or less is indicated in FIG. 9. Pressure sintering at 68 MPa is defined as a reference example. According to this, the density is higher than that of Comparative Example (without addition of a sintering agent) in a low pressure range of 5 MPa or more and 35 MPa or less. The apparent density when pressure-sintering was performed at 68 MPa is 7.77 Mg/m$^3$. With reference to the sintered body pressure-sintered at 68 MPa, the relative density is 99% or more even when the pressure is decreased to 10 MPa. This demonstrates that densification is also likely to occur by pressure sintering at low pressure, and mass productivity is high.

Example 5

In each condition of Example 2, the sintering agent was 0.1 mass %. The density in this case is 7.71 Mg/m$^3$ (99% in relative density with reference to the 68 MPa pressure-sintered body of the reference example). The result is indicated in FIG. 9. According to this, the density is higher than that of Comparative Example 2. This demonstrates that, for example, even when the amount of the sintering agent is small, densification is also likely to occur by pressure sintering at low pressure, and mass productivity is high.

Figure 10:
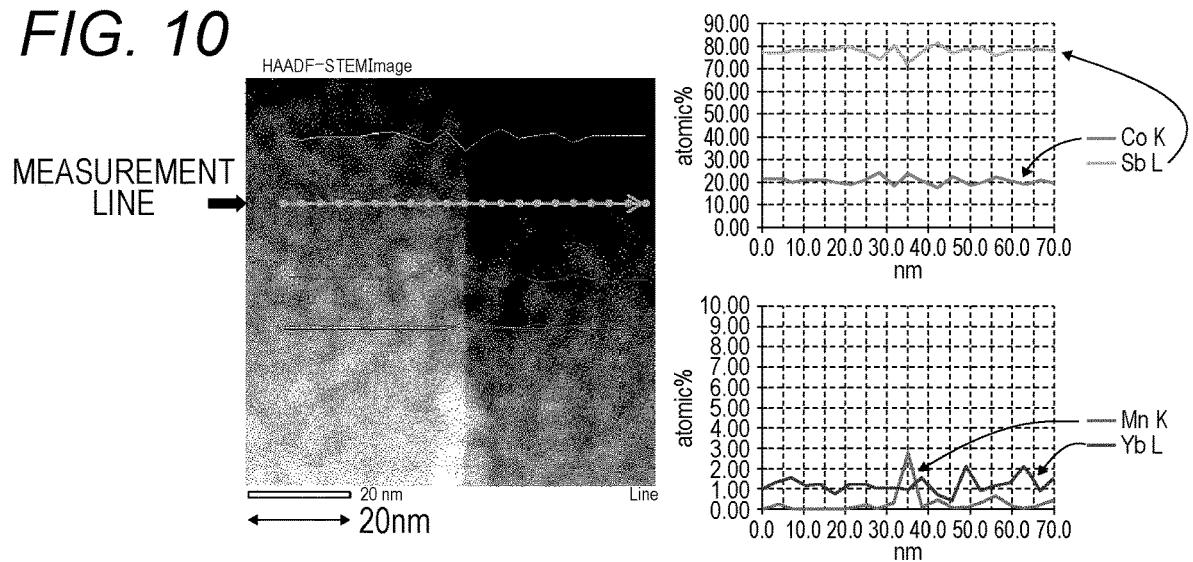
FIG. 10 illustrates a result of a HAADF-STEM-EDX line analysis at a grain boundary of a thermoelectric conversion element.

As illustrated in FIG. 10, 70 nm line analysis across the grain boundary was performed by high-angle annular dark field scanning TEM energy dispersive X-ray spectroscopy (HAADF-STEM-EDX) in the vicinity of the grain boundary of Example 3. This demonstrates that the concentration of Mn at the grain boundary tends to be 3 times higher than that in the vicinity of the grain boundary.

Example 6

A skutterudite powder and an MnSb fine powder were prepared by a similar process to that in Example 1. These were mixed in an MnSb addition amount of 0.05 mass % to prepare a mixed powder. This mixed powder was sintered at a sintering pressure of 10 MPa. The density of the sintered body was 7.70 Mg/m³. With reference to Example 4 or the sintered body pressurized at 68 MPa without addition of a sintering agent illustrated in FIG. 9, the relative density is 99%. Furthermore, the density is the same as that of the 10 MPa pressure-sintered body with addition of 1 mass % of a sintering agent in Example 4. This demonstrates that even when the added amount is 0.05 mass %, a densification effect is exerted comparably to 1 mass % addition.

The thermoelectric characteristics of the obtained sintered body were measured by a similar procedure to that in Example 1 and Comparative Example 1. As a result, at 300° C., a Seebeck coefficient is −160 μV/K, an electric resistance rate is 4.93 μΩm, and a power factor is 5.16 mW·m⁻¹·K⁻². At 400° C., a Seebeck coefficient is −171 μV/K, an electric resistance rate is 5.39 μΩm, and a power factor is 5.39 mW·m⁻¹·K⁻². At 500° C., a Seebeck coefficient is −179 μV/K, an electric resistance rate is 5.76 μΩm, and a power factor is 5.59 mW·m⁻¹·K⁻². Thus, lower resistance and higher power factor, compared to Comparative Example 1, were demonstrated.

Example 7

A skutterudite powder and an MnSb fine powder as a sintering agent were prepared by a similar process to that of Example 1. These were mixed in an MnSb addition amount of 1.5 mass % to prepare a mixed powder. This mixed powder was sintered at a sintering pressure of 5 MPa. The density of the sintered body was 7.54 Mg/m³. It was found that the density is higher than Comparative Example 3 and also can be increased by adding an MnSb fine powder.

Comparative Example 3

A sintered body at a sintering pressure of 5 MPa was prepared in a similar manner to that of Example 7, except that a sintering agent was not added. The density of the sintered body was measured. As a result, 7.08 Mg/m³ was obtained.

Example 8

A sintered body was prepared by a similar process to that of Example 7, except that the sintering pressure was 3 MPa. The density of the sintered body was measured. As a result, 7.36 Mg/m³ was obtained. It was found that the density is higher than that of Comparative Example 3 in spite of low sintering pressure and also can be increased by adding a sintering agent.

Example 9

As a sintering agent, manganese and antimony were weighed such that atomic ratio Mn/Sb=0.606 was achieved. A powder of a sintering agent was prepared by a similar process to that of Example 1 thereafter. This sintering agent was measured by XRD to find that this sintering agent was a mixture of $Mn_{1.1}Sb$ and Sb. A $Yb_{0.3}Co_4Sb_{12}$ skutterudite powder was prepared by a similar process to that of Example 1. In a similar manner to Example 7, these were mixed in a sintering agent powder addition amount of 1.5 mass % to prepare a mixed powder. This mixed powder was sintered at a sintering pressure of 5 MPa. The density of the sintered body was 7.57 Mg/m³. It was found that the density is higher than Comparative Example 3 and also can be increased by adding a sintering agent as a mixture of $Mn_{1.1}Sb$ and Sb.

Example 10

According to the composition formula of a thermoelectric conversion material $Ce_{0.2}(Co_{3.95} Mn_{0.05})Sb_{12}$, pure metals Ce, Co, Mn, and Sb were weighed, and a skutterudite powder was prepared by a similar process to that of Example 1 thereafter. By a similar process to that of Example 1, a sintering agent MnSb fine powder (a peak of an $Mn_{1.1}Sb$ single phase was indicated by XRD) was prepared, and the skutterudite powder and the MnSb fine powder were mixed.

Figure 11:
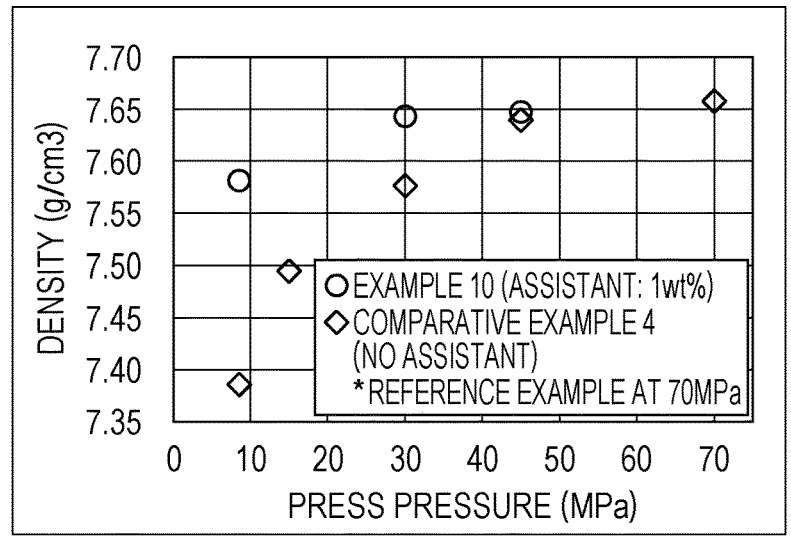
FIG. 11 is a correlation between pressure-sintering pressure and density in Example 10 and Comparative Example 4.

This mixed powder was used to obtain a sintered body at a varied sintering pressure in a range of 8.5 MPa or more and 45 MPa or less. The density of the obtained sintered body was 7.67 Mg/m³ at 45 MPa, 7.64 Mg/m³ at 30 MPa, and 7.58 Mg/m³ at 8.5 MPa. Changes of the pressure sintering pressure and the density are illustrated in FIG. 11. Pressure sintering at 70 MPa without addition of a sintering agent is defined as a reference example. This demonstrates that the density is higher than that of the sintered body without addition of a sintering agent in a low pressure range of 8.5 MPa or more and 45 MPa or less. Also, while the density of the 70 MPa pressure sintered body as a reference example was 7.66 Mg/m³, the relative density of the sintered body mixed with an MnSb fine powder as a sintering agent was as high as 99% even when the sintering pressure was decreased to 8.5 MPa. This demonstrated that a density of 7.50 Mg/m³ or more can be obtained in a range of 45 MPa or less.

Comparative Example 4

Pressure sintering was performed at a varied sintering pressure in a range of 8.5 MPa or more and 45 MPa or less in a similar manner to Example 10, except that a sintering agent was not added. The result is indicated in FIG. 11. The density of the sintered body was 7.64 Mg/m³ at 45 MPa, 7.58 Mg/m³ at 30 MPa, 7.50 Mg/m³ at 15 MPa, and 7.39 MPa at 8.5 MPa. In all of the sintering pressures, the density of Example 10 was higher, demonstrating a sintering promotion effect by a sintering agent.

Example 11

According to the composition formula of a thermoelectric conversion material $CoSb_3$, pure metals Co and Sb were weighed, and a skutterudite powder was prepared by a similar process to that of Example 1 thereafter. By a similar process to that of Example 1, an MnSb fine powder (which exhibited a peak of an $Mn_{1.1}Sb$ single phase by XRD) as a sintering agent was prepared, and the skutterudite powder and the MnSb fine powder were mixed (MnSb fine powder: 1 mass %).

Figure 12:
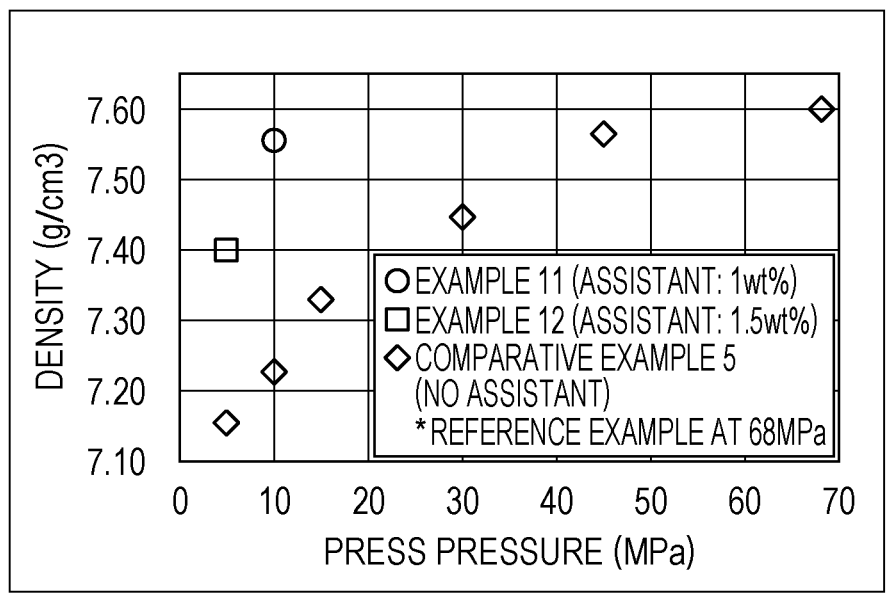
FIG. 12 is a correlation between pressure-sintering pressure and density in Example 11, Example 12, and Comparative Example 5.
Figure 13:
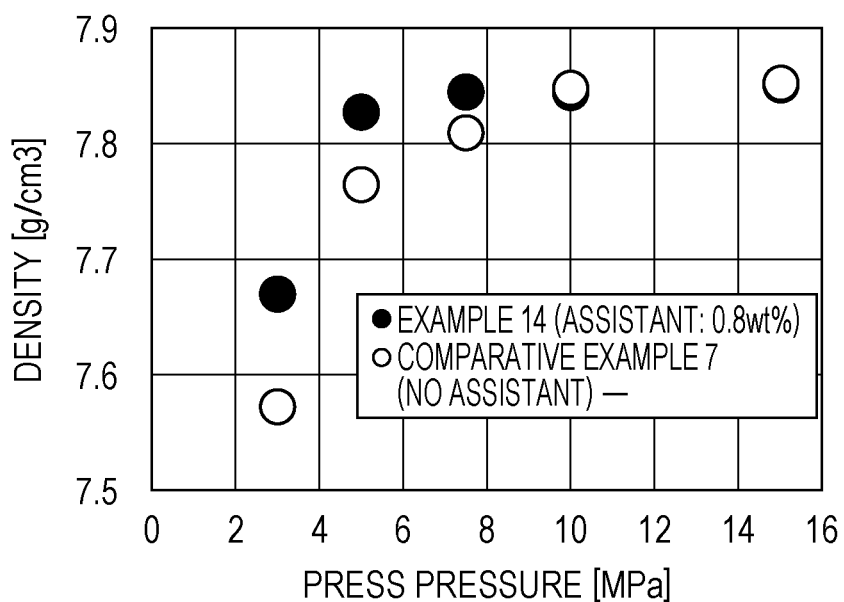
FIG. 13 is a correlation between pressure-sintering pressure and density in Example 14 and Comparative Example 7.

This mixed powder was pressure-sintered at a press pressure of 10 MPa. Otherwise, the conditions were similar to those of Example 1. The apparent density by the Archimedes method of the sintered body was 7.56 Mg/m³. Pressure sintering at 68 MPa without addition of a sintering agent is defined as a reference example. The density was 7.60 Mg/m³. This demonstrates that with reference to the 68 MPa sintered body, high density was obtained with a relative density of 99% even at a low pressure of 10 MPa, by adding a sintering agent. Also, the density was higher than the sintered body at 10 MPa in Comparative Example 5 (without addition of a sintering agent) described later. The result is indicated in FIG. 12.

Comparative Example 5

Pressure sintering was performed at a varied sintering pressure in a range of 5 MPa or more and 45 MPa or less in a similar manner to Example 11, except that a sintering agent is not added. The result is indicated in FIG. 12. The density was 7.57 Mg/m$^3$ at 45 MPa, 7.45 Mg/m$^3$ at 30 MPa, 7.33 Mg/m$^3$ at 15 MPa, 7.23 Mg/m$^3$ at 10 MPa, and 7.16 MPa at 5 MPa. In sintering at 45 MPa, a result comparable to that of Example 11 was obtained. At a sintering pressure of 30 MPa or less, the density of Example 11 was higher, demonstrating a sintering promotion effect by a sintering agent.

Example 12

As a comparison with 5 MPa pressure sintering of Comparative Example 5 (without addition of a sintering agent), sintering was performed at 5 MPa by adding, to a CoSb$_3$ skutterudite powder, a fine powder of a sintering agent prepared according to the formulation of atomic ratio Mn/Sb=2. This fine powder of a sintering agent was prepared by a similar process to that of Example 1 and mixed with a skutterudite powder such that 1.5 mass % was achieved. The density of the sintered body became 7.40 Mg/m$^3$ and was higher than that of the 5 MPa pressure sintered body indicated in Comparative Example 5.

Example 13

A mixed powder was prepared by a similar process to that of Example 11 (by mixing an MnSb fine powder to a thermoelectric material CoSb$_3$ skutterudite powder such that the MnSb fine powder became 1 mass %). The prepared mixed powder was pressure-sintered at 600° C. and a press pressure of 68 MPa. Except for the temperature and press pressure, the conditions are similar to those of Example 11. The density of the sintered body was 7.57 Mg/m$^3$. The density of the obtained sintered body was higher than that of Comparative Example 6, i.e., than the result of a case in which an MnSb sintering agent is not added. Also, compared to sintering at 700° C. and 68 MPa indicated in Example 11, high density was obtained in that the relative density was 100%, in spite of the fact that a sintering temperature was decreased from 700° C. to 600° C.

Comparative Example 6

A sintered body was prepared in a similar manner to Example 13, except that a sintering agent is not added. The density of the sintered body was measured. As a result, 7.40 Mg/m$^3$ was obtained. This demonstrates that the density was lower than a sample with addition of a sintering agent.

Example 14

An Mn$_{1.1}$Sb fine powder as a sintering agent was prepared by a similar process to that of Example 1. Next, according to the composition formula of a thermoelectric conversion material Ce$_1$(Fe$_{3.925}$Mn$_{0.075}$)Sb$_{12}$, pure metals Ce, Fe, Mn, and Sb were weighed. The weighed pure metal raw material was put in a carbon crucible and heated and melted in an inert gas atmosphere in a high-frequency melting furnace. After it was observed that molten metal was stirred by high frequency, the molten metal was poured into a mold. The ingot solidified in the mold was set in a liquid quenching solidification apparatus and melted again in an inert atmosphere. The temperature of the molten metal was measured by a radiation thermometer until 1100° C. was reached. Thereafter, the molten metal was sprayed on a revolving copper roll for quenching solidification. The quenching-solidified material was heat treated at 660° C. for 24 hours in an inert atmosphere and thereafter pulverized using a hammer mill. Accordingly, a powder (skutterudite powder) of a thermoelectric conversion material was obtained.

To the skutterudite powder, the Mn$_{1.1}$Sb fine powder was added such that 0.8 mass % was achieved relative to the total amount. The mixture was mixed. Pressure sintering was performed at a sintering temperature of 660° C. under five press pressure conditions of 3 MPa, 5 MPa, 7.5 MPa, 10 MPa, and 15 MPa to prepare a sintered body. Other sintering conditions are the same as those of Example 1. The density of the sintered body was 7.67 Mg/m$^3$ at 3 MPa, 7.83 Mg/m$^3$ at 5 MPa, 7.84 Mg/m$^3$ at 7.5 MPa, 7.84 Mg/m$^3$ at 10 MPa, and 7.85 Mg/m$^3$ at 15 MPa. When sintering is similarly performed at a press pressure of 68 MPa without addition of a sintering agent, as a reference example, 7.86 Mg/m$^3$ is obtained. This demonstrates that the relative density with reference to the pressure sintered body at a press pressure of 68 MPa is 98% in 3 MPa sintering and 100% in 5 MPa sintering. Thus, a density comparable to that by high pressure sintering was obtained even at low pressures. Also, in sintering at a low pressure of 7.5 MPa or less, the density was higher when a sintering agent was added, compared to Comparative Example 7 (without addition of a sintering agent).

The 3 MPa pressure sintered body was cut for measurement, and the thermoelectric characteristics were measured using a ZEM-3 of Advance Riko. As a result, at 300° C., a Seebeck coefficient was 140 µV/K, an electric resistance rate was 6.67 µΩm, and a power factor was 2.92 mW·m$^{-1}$·K$^{-2}$. At 400° C., a Seebeck coefficient was 152 µV/K, an electric resistance rate was 7.18 µΩm, and a power factor was 3.23 mW·m$^{-1}$·K$^{-2}$. At 500° C., a Seebeck coefficient was 162 µV/K, an electric resistance rate was 7.64 µΩm, and a power factor was 3.43 mW·m$^{-1}$·K$^{-2}$. Thus, the electric resistance was lower, and the power factor was higher, compared to Comparative Example 7 described later.

Comparative Example 7

A sintered body was prepared and evaluated in a similar manner to Example 14, except that a sintering agent is not added, and a press pressure during sintering is changed. The density of the sintered body was 7.57 Mg/m$^3$ at 3 MPa, 7.76 Mg/m$^3$ at 5 MPa, 7.81 Mg/m$^3$ at 7.5 MPa, 7.85 Mg/m$^3$ at 10 MPa, and 7.85 Mg/m$^3$ at 15 MPa.

The 3 MPa pressure sintered body was cut for measurement, and the thermoelectric characteristics were measured by a ZEM-3 of Advance Riko. As a result, in the sample prepared at a press pressure of 3 MPa, at 300° C., a Seebeck coefficient is 137 µV/K, an electric resistance rate is 7.83 µΩm, and a power factor is 2.39 mW·m$^{-1}$·K$^{-2}$. At 400° C., a Seebeck coefficient is 149 µV/K, an electric resistance rate is 8.44 µΩm, and a power factor is 2.64 mW·m$^{-1}$·K$^{-2}$. At 500° C., a Seebeck coefficient was 157 µV/K, an electric resistance rate was 8.93 µΩm, and a power factor was 2.76 mW·m$^{-1}$·K$^{-2}$.

The invention claimed is:

1. A method for producing a thermoelectric conversion element, comprising:
    a step of mixing a skutterudite-type thermoelectric conversion material powder containing Sb and a sintering assistant containing a compound including Mn and Sb, to obtain a mixture; and
    a step of sintering the mixture.

2. The method for producing the thermoelectric conversion element according to claim 1, wherein the compound including Mn and Sb has a peak of a crystal structure of at least one of Mn1.1Sb and Mn2Sb observed by XRD.

3. The method for producing the thermoelectric conversion element according to claim 1, wherein in the mixture, the sintering assistant is 10 mass % or less relative to a total amount of the thermoelectric conversion material powder and the sintering assistant.

4. The method for producing the thermoelectric conversion element according claim 1, wherein the thermoelectric conversion material powder contains Yb and Co.

5. The method for producing the thermoelectric conversion element according to claim 1, wherein the thermoelectric conversion material powder contains Ce and Fe.

6. The method for producing the thermoelectric conversion element according to claim 2, wherein in the mixture, the sintering assistant is 10 mass % or less relative to a total amount of the powder thermoelectric conversion material powder and the sintering assistant.

7. The method for producing the thermoelectric conversion element according to claim 2, wherein the thermoelectric conversion material powder contains Yb and Co.

8. The method for producing the thermoelectric conversion element according to claim 3, wherein the thermoelectric conversion material powder contains Yb and Co.

9. The method for producing the thermoelectric conversion element according to claim 6, wherein the thermoelectric conversion material powder contains Yb and Co.

10. The method for producing the thermoelectric conversion element according to claim 2, wherein the thermoelectric conversion material powder contains Ce and Fe.

11. The method for producing the thermoelectric conversion element according to claim 3, wherein the thermoelectric conversion material powder contains Ce and Fe.

12. The method for producing the thermoelectric conversion element according to claim 6, wherein the thermoelectric conversion material powder contains Ce and Fe.

* * * * *